US010380942B2

(12) United States Patent
An et al.

(10) Patent No.: US 10,380,942 B2
(45) Date of Patent: Aug. 13, 2019

(54) DRIVER INTEGRATED CIRCUIT FOR EXTERNAL COMPENSATION, DISPLAY DEVICE INCLUDING THE SAME, AND DATA CORRECTION METHOD OF DISPLAY DEVICE

(71) Applicant: LG Display Co., Ltd., Seoul (KR)

(72) Inventors: Changho An, Hwaseong-si (KR); Byungil Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 51 days.

(21) Appl. No.: 15/836,113

(22) Filed: Dec. 8, 2017

(65) Prior Publication Data

US 2018/0166515 A1 Jun. 14, 2018

(30) Foreign Application Priority Data

Dec. 12, 2016 (KR) ........................ 10-2016-0168599

(51) Int. Cl.
*G09G 3/3233* (2016.01)
*G09G 3/00* (2006.01)
(Continued)

(52) U.S. Cl.
CPC ......... *G09G 3/3233* (2013.01); *G09G 3/3225* (2013.01); *G09G 3/3291* (2013.01); *G09G 3/006* (2013.01); *G09G 3/3696* (2013.01); *G09G 2300/0861* (2013.01); *G09G 2310/027* (2013.01); *G09G 2310/0262* (2013.01); *G09G 2310/0289* (2013.01); *G09G 2320/0295* (2013.01); *G09G 2320/043* (2013.01); *G09G 2320/0693* (2013.01); *G09G 2330/028* (2013.01); *G09G 2330/12* (2013.01)

(58) Field of Classification Search
CPC .... G09G 3/3696; G09G 3/006; G09G 3/3291; G09G 3/3233; G09G 3/3225; G09G 3/3241; G09G 2310/0289; G09G 2320/0693; G09G 2320/043; G09G 2320/0295; G09G 2320/045; G09G 2330/12; G09G 2330/028
See application file for complete search history.

(56) References Cited

U.S. PATENT DOCUMENTS

2007/0152672 A1* 7/2007 Lee ........................ G09G 3/006 324/403
2008/0180365 A1* 7/2008 Ozaki .................. G09G 3/3233 345/76

(Continued)

*Primary Examiner* — Darlene M Ritchie
(74) *Attorney, Agent, or Firm* — Polsinelli PC

(57) ABSTRACT

A driver integrated circuit, a display device including the driver integrated circuit, and a data correction method of the display device are disclosed. The driver integrated circuit includes a voltage generator generating a sensing data voltage, a calibration unit that decodes N-bit calibration data input from the voltage generator and generates at least one calibration voltage, where N is a positive integer, a sensor that samples a signal output from a pixel corresponding to the sensing data voltage in a sensing mode for sensing electrical characteristics of the pixel and samples the calibration voltage in a calibration mode for sensing output characteristics of an analog-to-digital converter, and the analog-to-digital converter converting an analog signal sampled by the sensor into a digital signal.

17 Claims, 16 Drawing Sheets

(51) Int. Cl.
*G09G 3/36* (2006.01)
*G09G 3/3225* (2016.01)
*G09G 3/3291* (2016.01)

(56) References Cited

U.S. PATENT DOCUMENTS

| | | | | |
|---|---|---|---|---|
| 2008/0246785 | A1* | 10/2008 | Shirasaki | G09G 3/3233 345/690 |
| 2009/0051575 | A1* | 2/2009 | Lee | G09G 3/20 341/136 |
| 2009/0051628 | A1* | 2/2009 | Kwon | G09G 3/3233 345/77 |
| 2009/0213049 | A1* | 8/2009 | McCreary | G09G 3/3233 345/80 |
| 2009/0295422 | A1* | 12/2009 | Hamer | G09G 3/3233 324/760.02 |
| 2010/0225634 | A1* | 9/2010 | Levey | G09G 3/3208 345/212 |
| 2010/0245331 | A1* | 9/2010 | Shirouzu | G09G 3/3233 345/212 |
| 2011/0007067 | A1* | 1/2011 | Ryu | G09G 3/3233 345/214 |
| 2013/0141474 | A1* | 6/2013 | Kim | H03M 1/682 345/690 |
| 2014/0176622 | A1* | 6/2014 | Jung | G09G 3/3208 345/690 |
| 2015/0213757 | A1* | 7/2015 | Takahama | G09G 3/3266 345/691 |
| 2015/0302793 | A1* | 10/2015 | In | G09G 3/3208 345/211 |
| 2016/0314739 | A1* | 10/2016 | Huang | G09G 3/3233 |
| 2017/0025081 | A1* | 1/2017 | Satoh | G09G 3/3696 |
| 2017/0047017 | A1* | 2/2017 | Shirouzu | G09G 3/325 |
| 2017/0148385 | A1* | 5/2017 | Kishi | G09G 3/3225 |
| 2018/0018913 | A1* | 1/2018 | Kim | G09G 3/2092 |
| 2018/0090042 | A1* | 3/2018 | Lin | G09G 3/006 |
| 2018/0254006 | A1* | 9/2018 | Hwang | G09G 3/3233 |
| 2018/0366061 | A1* | 12/2018 | Furukawa | G09G 3/3233 |

* cited by examiner

| Switch / Mode | SW1 | SW2 | CSW | S1 | S2 | S3 | S4 |
|---|---|---|---|---|---|---|---|
| Current sensing mode | ON/OFF | OFF/ON | OFF | OFF | ON | ON | OFF |
| Calibration mode | OFF | OFF | ON | ON | OFF | OFF | ON |

DRIVER INTEGRATED CIRCUIT FOR EXTERNAL COMPENSATION, DISPLAY DEVICE INCLUDING THE SAME, AND DATA CORRECTION METHOD OF DISPLAY DEVICE

CROSS-REFERENCE TO RELATED APPLICATION

This application claims the benefit of Korea Patent Application No. 10-2016-0168599 filed on Dec. 12, 2016, which is incorporated herein by reference in its entirety for all purposes as if fully set forth herein.

BACKGROUND

Field of the Disclosure

The present disclosure relates to a display device, and more particularly, to a driver integrated circuit for external compensation, a display device including the driver integrated circuit, and a data correction method of the display device.

Description of the Background

Various types of panel displays have been developed and sold. Among the various types of panel displays, an electroluminescent display is classified into an inorganic electroluminescent display and an organic electroluminescent display depending on a material of an emission layer. In particular, an active matrix organic light emitting diode (OLED) display includes a plurality of OLEDs capable of emitting light by themselves and has many advantages, such as fast response time, high emission efficiency, high luminance, wide viewing angle, and the like.

An OLED serving as a self-emitting element includes an anode electrode, a cathode electrode, and an organic compound layer between the anode electrode and the cathode electrode. The organic compound layer includes a hole injection layer HIL, a hole transport layer HTL, an emission layer EML, an electron transport layer ETL, and an electron injection layer EIL. When power (voltage) is applied to the anode electrode and the cathode electrode, holes passing through the hole transport layer HTL and electrons passing through the electron transport layer ETL move to the emission layer EML and form excitons. As a result, the emission layer EML generates visible light.

An OLED display includes a plurality of pixels, each including an OLED and a thin film transistor (TFT) that adjusts a luminance of an image implemented on the pixels based on a grayscale of image data. The driving TFT controls a driving current flowing into the OLED depending on a voltage (hereinafter, referred to as "a gate-to-source voltage") between a gate electrode and a source electrode of the driving TFT. The amount of light emitted by the OLED is determined depending on the driving current of the OLED, and the luminance of the image is determined depending on the amount of light emitted by the OLED.

In general, when a driving TFT operates in a saturation region, a driving current Ids flowing between a drain electrode and a source electrode of the driving TFT is expressed by the following Equation 1.

$$Ids=\frac{1}{2}*(\mu*C*W/L)*(Vgs-Vth)^2 \quad \text{[Equation 1]}$$

In the above Equation 1, μ is electron mobility, C is a capacitance of a gate insulating layer, W is a channel width of the driving TFT, and L is a channel length of the driving TFT. In addition, Vgs is a voltage between a gate electrode and a source electrode of the driving TFT, and Vth is a threshold voltage (or a critical voltage) of the driving TFT. A gate-to-source voltage Vgs of the driving TFT may be a voltage differential between a data voltage and a reference voltage in accordance with a pixel structure. The data voltage is an analog voltage corresponding to a grayscale of image data, and the reference voltage is a fixed voltage. Therefore, the gate-to-source voltage Vgs of the driving TFT is programmed or set depending on the data voltage. Then, the driving current Ids is determined depending on the programmed gate-to-source voltage Vgs.

Electrical characteristics of the pixel, such as the threshold voltage Vth and the electron mobility μ of the driving TFT and a threshold voltage of the OLED, may be factors determining the amount of driving current Ids of the driving TFT. Therefore, all the pixels should have the same electrical characteristics. However, a variation in the electrical characteristics between the pixels may be caused by various factors such as manufacturing process characteristics and time-varying characteristics. The variation in the electrical characteristics between the pixels may lead to a luminance variation, and it is difficult to implement desired images or meet image quality requirements.

In order to compensate for the luminance variation between the pixels, there are so-called external compensation techniques for sensing electrical characteristics of the pixels and correcting (or compensating for) an input image based on the sensing result. In order to compensate for the luminance variation, a current change by an amount of Δy has to be ensured when the data voltage applied to the pixel is changed by an amount of "Δx". Thus, the external compensation technique is to implement the same (or effectively the same) brightness by calculating "Δx" for each pixel and applying the same driving current to the OLED. Namely, the external compensation technique may be implemented to adjust the gray levels so that the pixels have the same or effectively the same brightness.

In order to implement the external compensation technique, a sensor for sensing electrical characteristics of the pixels and an analog-to-digital converter (ADC) for converting analog sensing data input from the sensor into digital sensing data are required.

The digital sensing data output from the ADC may be distorted by various causes. Among the various causes, the distortion due to a characteristic variation between the ADCs is particularly problematic. When the digital sensing data is distorted, a luminance variation resulting from a difference in the electrical characteristics between the pixels cannot be compensated properly.

SUMMARY

The present disclosure provides a driver integrated circuit for external compensation, a display device including the driver integrated circuit, and a data correction method of the display device capable of increasing a sensing performance and a compensation performance of electrical characteristics of pixels by compensating for a characteristic variation between analog-to-digital converts.

In one aspect, there is provided a driver integrated circuit for external compensation including a voltage generator configured to generate a sensing data voltage; a calibration unit configured to decode N-bit calibration data input from the voltage generator and generate at least one calibration voltage, where N is a positive integer; a sensor configured to sample a signal output from a pixel corresponding to the sensing data voltage in a sensing mode for sensing electrical characteristics of the pixel and sample the at least one calibration voltage in a calibration mode for sensing output characteristics of an analog-to-digital converter; and the analog-to-digital converter configured to convert an analog signal sampled by the sensor into a digital signal.

BRIEF DESCRIPTION

The accompanying drawings, which are included to provide a further understanding of the present disclosure and are incorporated in and constitute a part of this disclosure, illustrate aspects of the disclosure and together with the description serve to explain the principles of the disclosure.

In the drawings:

FIG. 1 is a block diagram of an electroluminescent display for external compensation according to an aspect of the disclosure;

FIG. 2 schematically illustrates a connection configuration between a pixel and a driver integrated circuit for external compensation according to an aspect of the disclosure;

DETAILED DESCRIPTION

Figure 1:
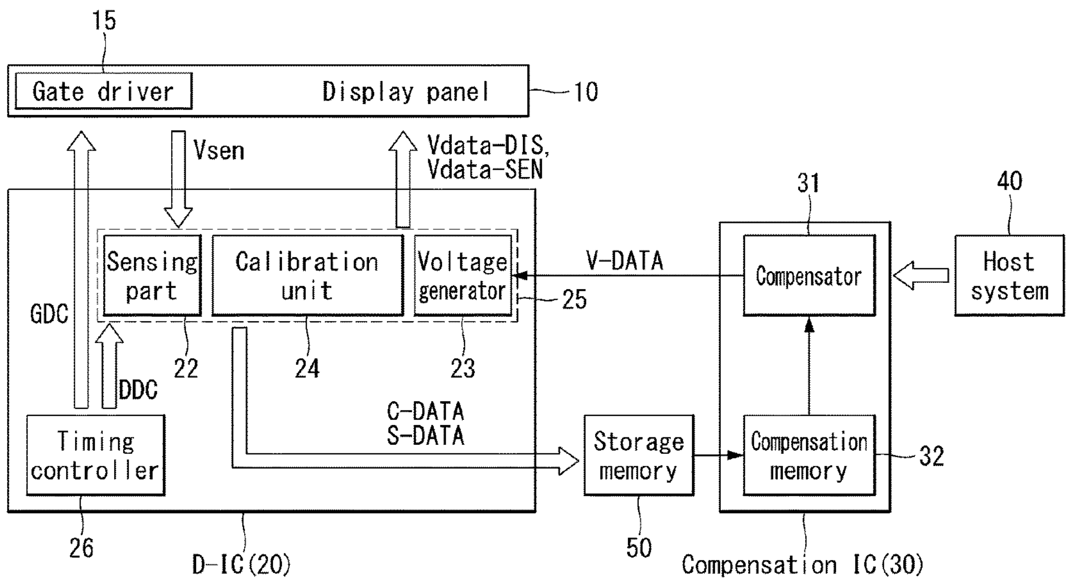

Reference will now be made in detail to aspects of the present disclosure, examples of which are illustrated in the accompanying drawings. However, the present disclosure is not limited to aspects disclosed below, and may be implemented in various forms. These aspects are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing aspects of the present disclosure are merely exemplary, and the present disclosure is not limited thereto unless specified as such. Like reference numerals designate like elements throughout. In the following description, a detailed description of certain functions or configurations related to this document that may unnecessarily cloud the gist of the disclosure have been omitted.

In the present disclosure, when the terms “include”, “have”, “comprised of”, etc. are used, other components may be added unless “~only” is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned “on or above”, “under or below”, “next to” another structure, this description should be construed as including a case in which the structures directly contact each other as well as a case in which a third structure is disposed therebetween.

The terms “first”, “second”, etc. may be used to describe various components, but the components are not limited by such terms. The terms are used only for the purpose of distinguishing one component from other components. For example, a first component may be designated as a second component, and vice versa, without departing from the scope of the present disclosure.

The features of various aspects of the present disclosure can be partially combined or entirely combined with each other, and can be technically interlocking-driven in various ways. The aspects can be independently implemented, or can be implemented in conjunction with each other.

Various aspects of the present disclosure will be described in detail below with reference to the accompanying drawings. In the following aspects, an electroluminescent display will be described focusing on an organic light emitting diode (OLED) display including an organic light emitting material. However, it should be noted that aspects of the present disclosure are not limited to the OLED display, and may be applied to an inorganic light emitting display including an inorganic light emitting material. Further, it should be noted that aspects of the present disclosure may be applied not only to an electroluminescent display but also to various display devices such as a flexible display device and a wearable display device.

Figure 2:
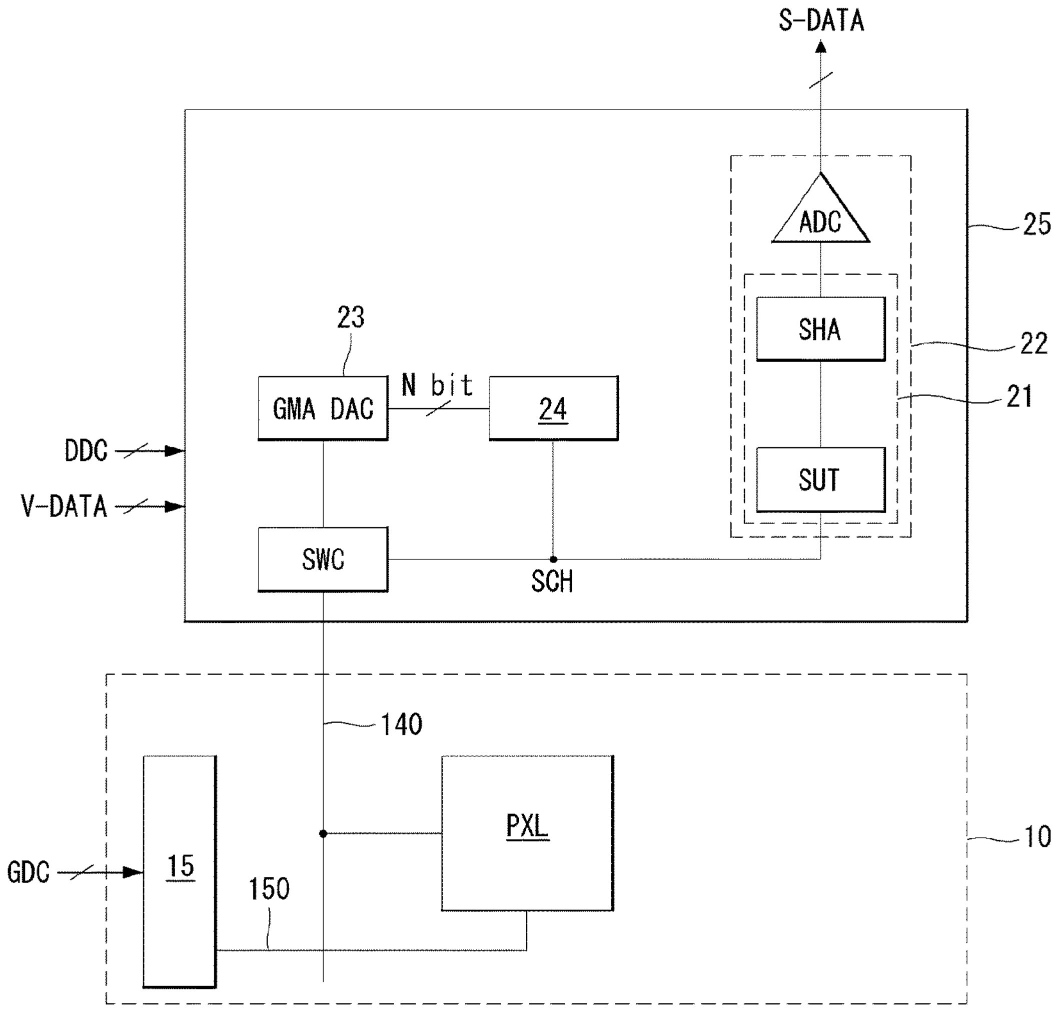
Figure 3:
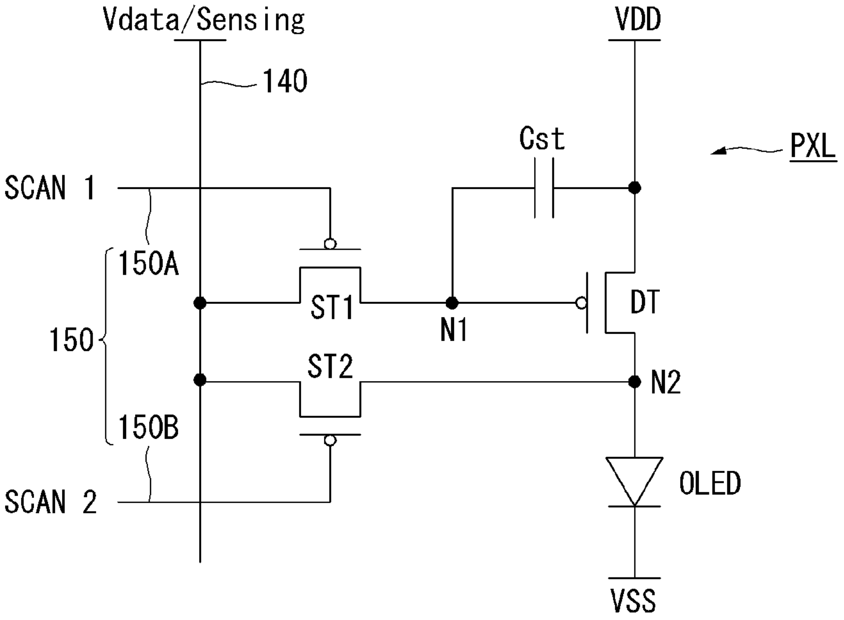
FIG. 3 is an equivalent circuit diagram of a pixel according to an aspect of the disclosure.
Figure 4:
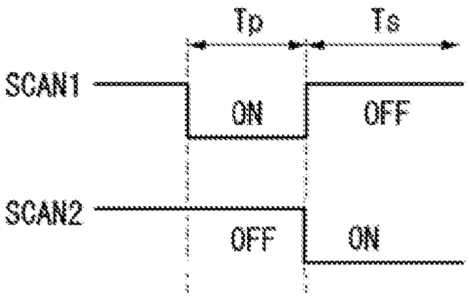
FIG. 4 is a driving timing diagram of the pixel of FIG. 3.
Figure 5:
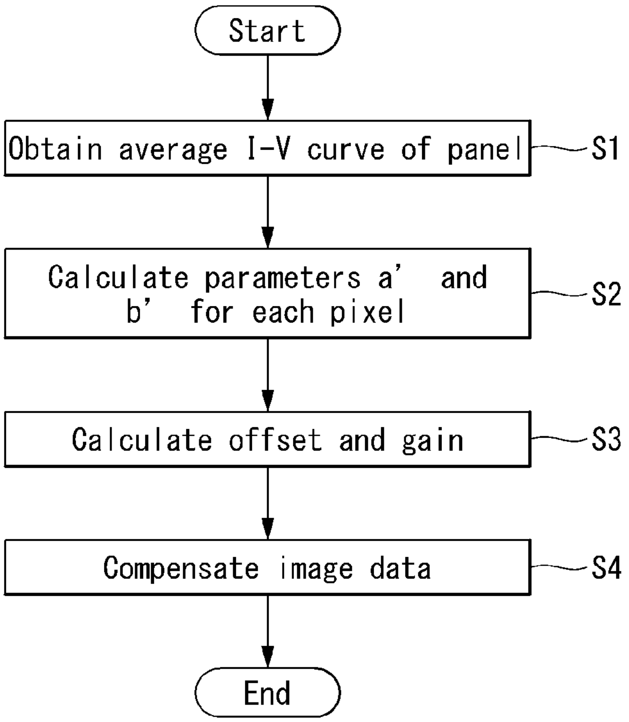
FIG. 5 is a flow chart illustrating an external compensation method according to an aspect of the disclosure.
Figure 6A:
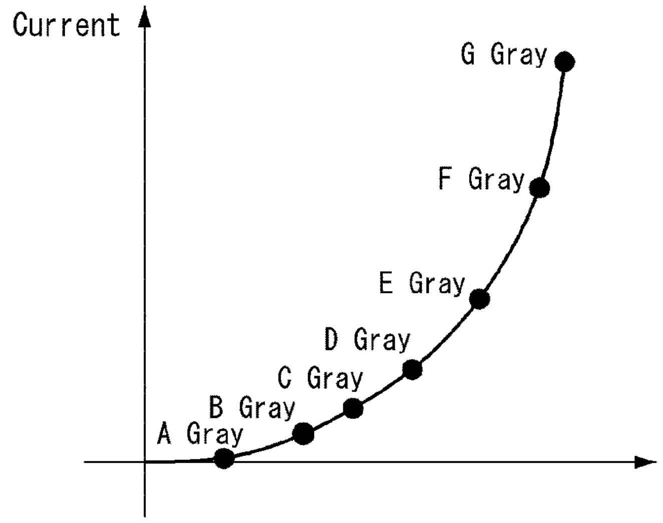
FIG. 6A illustrates a reference curve equation obtained by the external compensation method of FIG. 5.
Figure 6B:
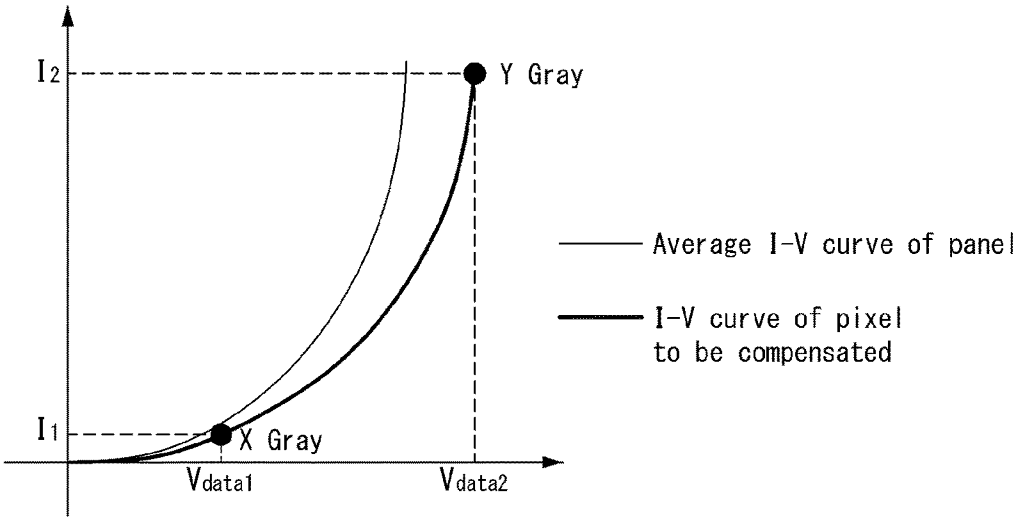
FIG. 6B illustrates an average I-V curve of a display panel and an I-V curve of a pixel to be compensated in an external compensation method of FIG. 5.
Figure 6C:
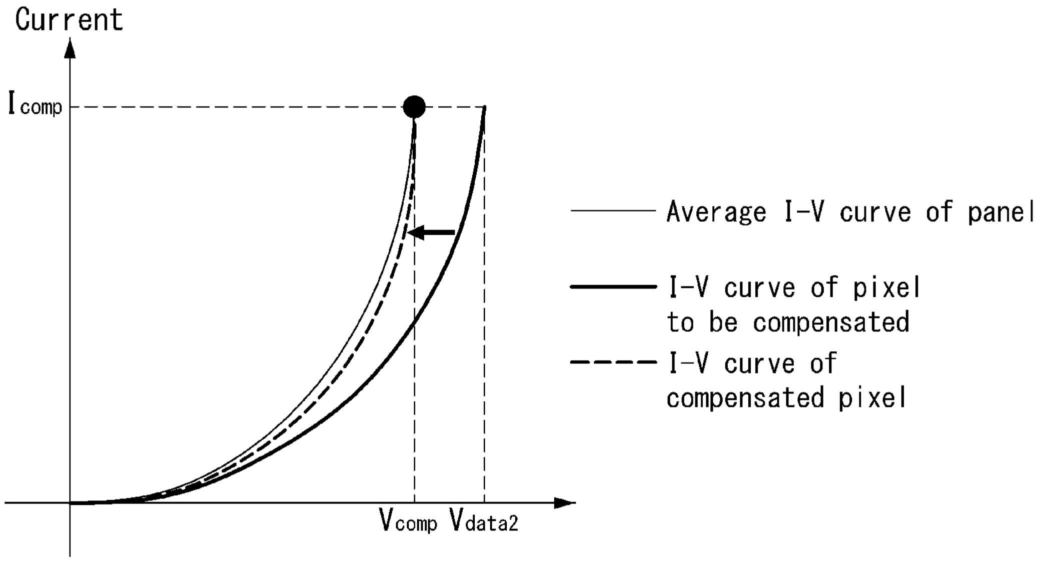
FIG. 6C illustrates an average I-V curve of a display panel, an I-V curve of a pixel to be compensated, and an I-V curve of a compensated pixel by using the external compensation method of FIG. 5.

FIG. 1 is a block diagram of an electroluminescent display for external compensation according to an aspect of the disclosure. FIG. 2 schematically illustrates a connection configuration between and a pixel and a driver integrated circuit (IC) for external compensation according to an aspect of the disclosure. FIG. 3 is an equivalent circuit diagram of a pixel according to an aspect of the disclosure. FIG. 4 is a driving timing diagram of the pixel of FIG. 3. FIG. 5 is a flow chart illustrating an external compensation method according to an aspect of the disclosure. FIG. 6A illustrates a reference curve equation obtained by using the external compensation method of FIG. 5. FIG. 6B illustrates an average I-V curve of a display panel and an I-V curve of a pixel to be compensated in the external compensation method of FIG. 5. FIG. 6C illustrates an average I-V curve of a display panel, an I-V curve of a pixel to be compensated, and an I-V curve of a compensated pixel by using the external compensation method of FIG. 5.

Referring to FIGS. 1 to 4, an electroluminescent display according to an aspect of the disclosure may include a display panel 10, a driver IC (or referred to as "D-IC") 20, a compensation IC 30, a host system 40, and a storage memory 50.

The display panel 10 includes a plurality of pixels PXL and a plurality of signal lines. The signal lines may include data lines 140 for supplying data signals (e.g., an analog data voltage Vdata) to the pixels PXL and gate lines 150 for supplying a gate signal to the pixels PXL.

In the aspects disclosed herein, the gate signal may include a plurality of gate signals including a first gate signal SCAN1 and a second gate signal SCAN2. In this instance, each gate line 150 may include a first gate line 150A for supplying the first gate signal SCAN1 and a second gate line 150B for supplying the second gate signal SCAN2. However, the gate signal may include one gate signal depending on a circuit configuration of the pixel PXL. In this instance, each gate line 150 may include a single gate line. Aspects are not limited to exemplary configurations of the gate signal and the gate line 150.

Electrical characteristics of the pixels PXL may be sensed through the data lines 140. In the following description, it is described that the electrical characteristics of the pixels PXL are sensed through the data lines 140 for convenience, but the present disclosure is not limited thereto. The present disclosure may be applied to any case in which the electrical characteristics of the pixels PXL are sensed through not the data lines 140 but separate signal lines.

The pixels PXL of the display panel 10 are disposed in a matrix to form a pixel array. Each pixel PXL may be connected to one of the data lines 140 and at least one of the gate lines 150. Each pixel PXL is configured to receive a high potential driving power VDD and a low potential driving power VSS from a power source or a power generator. To this end, the power generator may supply the high potential driving power VDD to the pixel PXL through a high potential driving power line or a pad and may supply the low potential driving power VSS to the pixel PXL through a low potential driving power line or a pad.

A gate driver 15 may generate a display gate signal necessary for a display drive operation and a sensing gate signal necessary for a sensing drive operation. Each of the display gate signal and the sensing gate signal may include a first gate signal SCAN1 and a second gate signal SCAN2.

In the display drive operation, the gate driver 15 may generate a first display gate signal SCAN1 to supply the first display gate signal SCAN1 to the first gate line 150A, and may generate a second display gate signal SCAN2 to supply the second display gate signal SCAN2 to the second gate line 150B. The first display gate signal SCAN1 and the second display gate signal SCAN2 are signals synchronized with an application timing of a display data voltage Vdata-DIS.

In the sensing drive operation, the gate driver 15 may generate a first sensing gate signal SCAN1 to supply the first sensing gate signal SCAN1 to the first gate line 150A, and may generate a second sensing gate signal SCAN2 to supply the second sensing gate signal SCAN2 to the second gate line 150B. The first sensing gate signal SCAN1 and the second sensing gate signal SCAN2 are signals synchronized with an application timing of a sensing data voltage Vdata-SEN. Further, the second sensing gate signal SCAN2 may be synchronized with sensing timing.

The gate driver 15 may be directly formed on a lower substrate of the display panel 10 in a gate driver-in panel (GIP) manner. The gate driver 15 may be formed in a non-display area (i.e., a bezel area) outside the pixel array of the display panel 10 through the same TFT process as the pixel array.

The driver IC 20 is connected to the data lines 140 of the display panel 10 through a channel terminal. The driver IC 20 includes a timing controller 26 and a data driver 25.

The timing controller 26 may generate a gate timing control signal GDC for controlling operation timing of the gate driver 15 and a data timing control signal DDC for controlling operation timing of the data driver 25 based on timing signals, for example, a vertical sync signal Vsync, a horizontal sync signal Hsync, a dot clock signal DCLK, and a data enable signal DE received from the host system 40.

The data timing control signal DDC may include a source start pulse, a source sampling clock, and a source output enable signal, and the like, but is not limited thereto. The source start pulse controls a start time of data sampling of the data driver 25. The source sampling clock is a clock signal that controls sampling timing of data based on a rising edge or a falling edge thereof. The source output enable signal controls output timing of the data driver 25.

The gate timing control signal GDC may include a gate start pulse, a gate shift clock, and the like, but is not limited thereto. The gate start pulse is applied to a stage of the gate driver 15 for generating a first output and activates an operation of the stage. The gate shift clock is a clock signal that is commonly input to stages and shifts the gate start pulse.

The timing controller 26 may control a calibration mode for a calibration drive operation, a sensing mode for a sensing drive operation, and a display mode for a display drive operation in accordance with a particular control sequence.

In the calibration mode, first characteristic data C-DATA indicating output characteristics of an analog-to-digital converter (ADC) is obtained. In the sensing mode, second characteristic data S-DATA indicating electrical characteristics of the pixel PXL is obtained. In the display mode, image data to be written to the pixels PXL is corrected based on the first characteristic data C-DATA obtained in the calibration mode and the second characteristic data S-DATA obtained in the sensing mode; the corrected image data is converted into the display data voltage Vdata-DIS; and the display data voltage Vdata-DIS is applied to the pixels PXL.

The timing controller 26 may differently generate timing control signals for the display drive operation, timing control signals for the sensing drive operation, and timing control signals for the calibration drive operation. However, aspects are not limited thereto. The sensing drive operation may be performed in a vertical blanking interval during the display drive operation, in a power-on sequence interval before the beginning of the display drive operation, or in a power-off sequence interval after the end of the display drive operation under the control of the timing controller 26. However, aspects are not limited thereto. For example, the sensing drive operation may be performed in a vertical active period during the display drive operation. Further, the calibration drive operation may be performed in the vertical blanking interval during the display drive operation, in the power-on sequence interval before the beginning of the display drive operation, or in the power-off sequence interval after the end of the display drive operation. However, the present disclosure is not limited thereto.

The vertical blanking interval is time, for which input image data is not written, and is arranged between vertical active periods in which input image data of one frame is written. The power-on sequence interval is a transient time between the turn-on of driving power and the beginning of image display. The power-off sequence interval is a transient time between the end of image display and the turn-off of driving power.

The timing controller 26 may control some or all of the operations for the sensing drive operation in accordance with a particular sensing process. Namely, the sensing drive operation may be performed in a state (for example, a standby mode, a sleep mode, a low power mode, etc.) where only a screen of the display device is turned off while the system power is being applied. However, the present disclosure is not limited thereto.

The timing controller 26 may control some or all of the operations for the calibration drive operation in accordance with a particular calibration process. Because a change (for example, offset change) in characteristics of the ADC proceeds relatively slower than a change in the electrical characteristics of the pixel PXL, the calibration drive operation may be performed once each time the sensing drive operation is performed a plurality of times. However, the present disclosure is not limited thereto.

ADC variation compensation (AVC) data (i.e., the first characteristic data C-DATA) obtained in the calibration mode is reflected in a compensation value for compensating for the change in the electrical characteristics of the pixel PXL, thereby preventing a sensing performance and a compensation performance from being reduced by an output variation of the ADC.

The data driver 25 includes a sensing part 22, a voltage generator 23, a calibration unit 24, and a switching unit SWC.

The voltage generator 23 may include a digital-to-analog converter (DAC) converting a digital signal into an analog signal and an output buffer. A gamma DAC GMA DAC generates the display data voltage Vdata-DIS or the sensing data voltage Vdata-SEN.

In the display drive operation, the voltage generator 23 converts corrected image data V-DATA into an analog gamma voltage using the gamma DAC GMA DAC and supplies the data lines 140 with the display data voltage Vdata-DIS as a conversion result. In the display drive operation, the display data voltage Vdata-DIS supplied to the data lines 140 is applied to the pixels PXL in synchronization with turn-on timing of the first and second display gate signals. A gate-to-source voltage of a driving thin film transistor (TFT) included in the pixel PXL is programmed by the display data voltage Vdata-DIS, and a driving current flowing in the driving TFT is determined depending on the gate-to-source voltage of the driving TFT.

In the sensing drive operation, the voltage generator 23 generates the previously set sensing data voltage Vdata-SEN using the gamma DAC GMA DAC and supplies the sensing data voltage Vdata-SEN to the data lines 140. In the sensing drive operation, the sensing data voltage Vdata-SEN supplied to the data lines 140 is applied to the pixels PXL in synchronization with turn-on timing of the first and second sensing gate signals SCAN1 and SCAN2. The gate-to-source voltage of the driving TFT included in the pixel PXL is programmed by the sensing data voltage Vdata-SEN, and a driving current flowing in the driving TFT is determined depending on the gate-to-source voltage of the driving TFT.

In the calibration drive operation, the calibration unit 24 decodes N-bit calibration data input from the gamma DAC GMA DAC to generate a calibration voltage, where N is a positive integer. The calibration unit 24 stabilizes the calibration voltage and supplies the calibration voltage to the plurality of sensing parts 22. The calibration unit 24 may include a calibration switch and a global calibration buffer (hereinafter referred to as "calibration buffer") connected to a decoder. One calibration unit 24 may be present inside the driver IC 20 and may be commonly connected to the plurality of sensing parts 22.

When the calibration voltage is generated and supplied using the calibration unit 24 inside the driver IC 20, the number of signal lines and a circuit area can be reduced, compared to the case where the calibration voltage is generated from a separate external voltage source and is supplied to the driver IC 20. Further, in this instance, because a signal delay is significantly reduced, the output characteristics of the ADC can be accurately sensed.

Each pixel PXL may be implemented by configuration illustrated in FIG. 3. Referring to FIG. 3, each of the pixels PXL constituting the pixel array may include an OLED, a driving TFT DT, a storage capacitor Cst, a first switching TFT ST1, and a second switching TFT ST2. The TFTs included in the pixel PXL may be implemented as p-type metal-oxide semiconductor (PMOS) transistors. The pixel configuration of FIG. 3 is an example, and the present disclosure is not limited thereto.

In FIG. 3, a first gate signal SCAN1 may be a first display gate signal SCAN1 or a first sensing gate signal SCAN1, and a second gate signal SCAN2 may be a second display gate signal SCAN2 or a second sensing gate signal SCAN2. Further, a data voltage Vdata supplied to the data line 140 by the voltage generator 23 may be a display data voltage Vdata-DIS (see FIG. 1) or a sensing data voltage Vdata-SEN (shown in FIG. 1).

The OLED is a light emitting element that emits light with a driving current input from the driving TFT DT. The OLED includes an anode electrode, a cathode electrode, and an organic compound layer between the anode electrode and the cathode electrode. The anode electrode is connected to a second node N2, which is a drain electrode of the driving TFT DT. The cathode electrode is connected to an input terminal of a low potential driving voltage VSS. A gray level of an image displayed on a corresponding pixel PXL is determined depending on an amount of light emitted by the OLED.

The driving TFT DT is a driving element controlling a driving current input to the OLED depending on a gate-to-source voltage Vgs of the driving TFT DT. The driving TFT DT includes a gate electrode connected to a first node N1, a source electrode connected to an input terminal of a high potential driving voltage VDD, and a drain electrode connected to the second node N2. The gate-to-source voltage Vgs of the driving TFT DT is a voltage difference between the high potential driving power VDD and a voltage of the first node N1.

The storage capacitor Cst is connected between the input terminal of the high potential driving voltage VDD and the first node N1. The storage capacitor Cst holds the gate-to-source voltage Vgs of the driving TFT DT for a particular time.

The first switching TFT ST1 applies the data voltage Vdata on the data line 140 to the first node N1 in response to the first gate signal SCAN1. The first switching TFT ST1 includes a gate electrode connected to the first gate line 150A, a source electrode connected to the data line 140, and a drain electrode connected to the first node N1.

The second switching TFT ST2 switches on and off a current flow between the second node N2 and the data line 140 in response to the second gate signal SCAN2. The second switching TFT ST2 includes a gate electrode connected to the second gate line 150B, a drain electrode connected to the data line 140, and a source electrode connected to the second node N2. When the second switching TFT ST2 is turned on, the second node N2 and a sensor 21 are electrically connected.

As shown in FIG. 4, the sensing drive operation may be performed including a programming period Tp and a sensing period Ts. During the programming period Tp, the data voltage Vdata is applied to the first node N1 of the pixel PXL in synchronization with a turn-on timing of the first gate signal SCAN1 and a turn-off timing of the second gate signal SCAN2. In this instance, because the gate-to-source voltage Vgs of the driving TFT DT is greater than a threshold voltage of the driving TFT DT, the driving TFT DT is turned on and a driving current flows in the driving TFT DT. During the sensing period Ts, the driving current flowing in the driving TFT DT is input to the sensing part 22 via the second switching TFT ST2, the data line 140, and the switching unit SWC in synchronization with a turn-off timing of the first gate signal SCAN1 and a turn-on timing of the second gate signal SCAN2.

The sensing part 22 may include a sensor 21 and an ADC that operate in the sensing mode and the calibration mode.

In the sensing drive operation, the sensor 21 may receive and sense electrical characteristics (for example, electrical characteristics of the driving TFTs and/or the OLEDs included in the pixels PXL) of the pixels PXL through the data lines 140 and the switching unit SWC in synchronization with the turn-off timing of the first gate signal SCAN1 and the turn-on timing of the second gate signal SCAN2. In the calibration drive operation, the sensor 21 may receive and sample a calibration voltage from the calibration unit 24.

As shown in FIG. 2, the sensor 21 may further include a sensing unit SUT and a sample and holder SHA for sampling an output of the sensing unit SUT. The sensing unit SUT may be implemented as a hybrid sensing unit capable of performing both a current sensing operation and a voltage sensing operation.

In the sensing drive operation, the sensing unit SUT may be implemented as a current sensing unit capable of directly sensing the driving current flowing in the driving TFT of the pixel PXL. In the calibration drive operation, the sensing unit SUT may be implemented as a voltage sensing unit capable of sensing the calibration voltage. The sample and holder SHA samples an output of the sensing unit SUT and supplies the sampled output to the ADC.

In the calibration drive operation, the ADC converts an analog sampling signal input from the sample and holder SHA into a digital signal and outputs the first characteristic data C-DATA indicating output characteristics of the ADC. In the sensing drive operation, the ADC converts an analog sampling signal input from the sample and holder SHA into a digital signal and outputs the second characteristic data S-DATA indicating electrical characteristics of the pixel PXL.

The ADC may be implemented as a flash ADC, an ADC using a tracking method, a successive approximation register ADC, and the like. The ADC stores the first characteristic data C-DATA obtained in the calibration drive operation in the storage memory 50. The ADC stores the second characteristic data S-DATA obtained in the sensing drive operation in the storage memory 50.

The switching unit SWC differently operates in the calibration mode, the sensing mode, and the display mode. The switching unit SWC is connected to the voltage generator 23 and the sensor 21 and is also connected to the pixel PXL through a channel terminal.

The storage memory 50 stores the first characteristic data C-DATA and the second characteristic data S-DATA. The storage memory 50 may be implemented as a flash memory, but is not limited thereto.

In order to perform the display drive operation, the compensation IC 30 calculates an offset and a gain for each pixel based on the first characteristic data C-DATA and the second characteristic data S-DATA read from the storage memory 50. The compensation IC 30 modulates (or corrects) digital image data to be input to the pixels PXL depending on the calculated offset and gain and supplies the modulated digital image data V-DATA to the driver IC 20. To this end, the compensation IC 30 may include a compensator 31 and a compensation memory 32.

The compensation memory 32 transmits the first characteristic data C-DATA and the second characteristic data S-DATA read from the storage memory 50 to the compensator 31. The compensation memory 32 may be a random access memory (RAM), for example, a double data rate synchronous dynamic RAM (DDR SDRAM), but is not limited thereto.

As shown in FIGS. 5 to 6C, the compensator 31 may include a compensation algorithm that performs a compensation operation so that a current (I)-voltage (V) curve of a corresponding pixel to be compensated to match an average I-V curve. The average I-V curve may be obtained through a plurality of sensing operations.

More specifically, as shown in FIGS. 5 and 6A, the compensator 31 performs the sensing of a plurality of gray levels (for example, a total of seven gray levels A to G) and then obtains the following Equation 2 corresponding to the average I-V curve through a least square method in step S1.

$$I=a(V_{data}-b)^c \quad \text{[Equation 2]}$$

where "a" is electron mobility of the driving TFT, "b" is a threshold voltage of the driving TFT, and "c" is a physical property value of the driving TFT.

As shown in FIGS. 5 and 6B, the compensator 31 calculates parameter values a' and b' of the corresponding pixel based on current values I1 and I2 and gray values (gray levels X and Y) (i.e., data voltage values Vdata1 and Vdata2 of digital level) measured at two points in step S2.

$$I_1=a'(V_{data1}-b')^c \quad \text{[Equation 3]}$$

$$I_2=a'(V_{data2}-b')^c$$

The compensator 31 may calculate the parameter values a' and b' of the corresponding pixel using a quadratic equation in the above Equation 3.

As shown in FIGS. 5 and 6C, the compensator 31 may calculate an offset and a gain for causing the I-V curve of the corresponding pixel to be compensated to match the average I-V curve in step S3. The offset and the gain of the compensated pixel are expressed by Equation 4.

$$V\text{comp}=(a/a')^{1/c}\times V\text{data}+\{b'-b(a/a')^{1/c}\} \quad \text{[Equation 4]}$$

where "Vcomp" is a compensation voltage of digital level.

The compensator 31 corrects digital image data to be input to the corresponding pixel so that the digital image data corresponds to the compensation voltage Vcomp, in step S4.

The host system 40 may supply digital image data to be input to the pixels PXL of the display panel 10 to the compensation IC 30. The host system 40 may further supply user input information, for example, digital brightness information to the compensation IC 30. The host system 40 may be implemented as an application processor.

Figure 7:
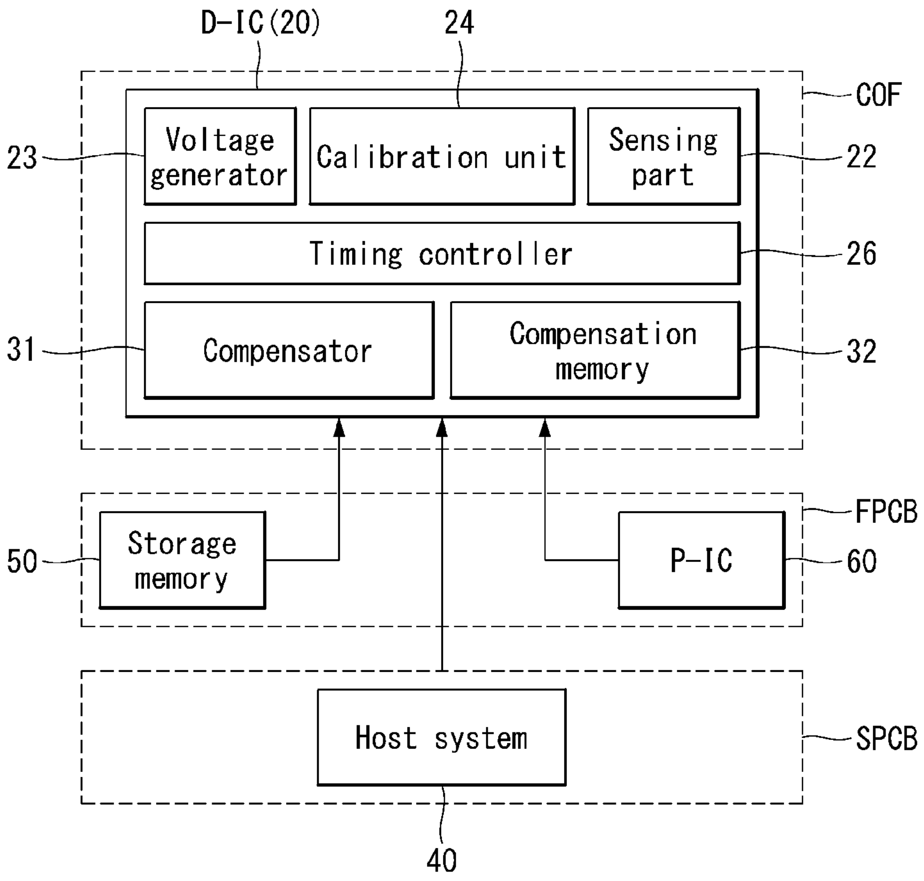
FIGS. 7 to 9 illustrate various examples of an external compensation module.
Figure 8:
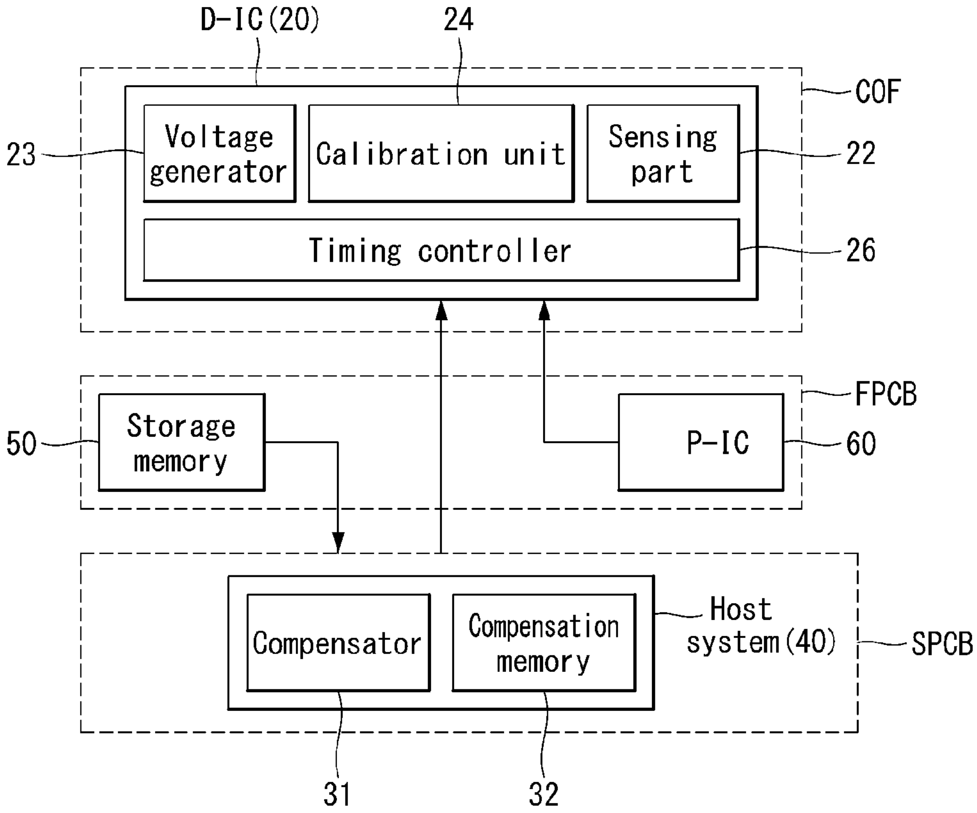
Figure 9:
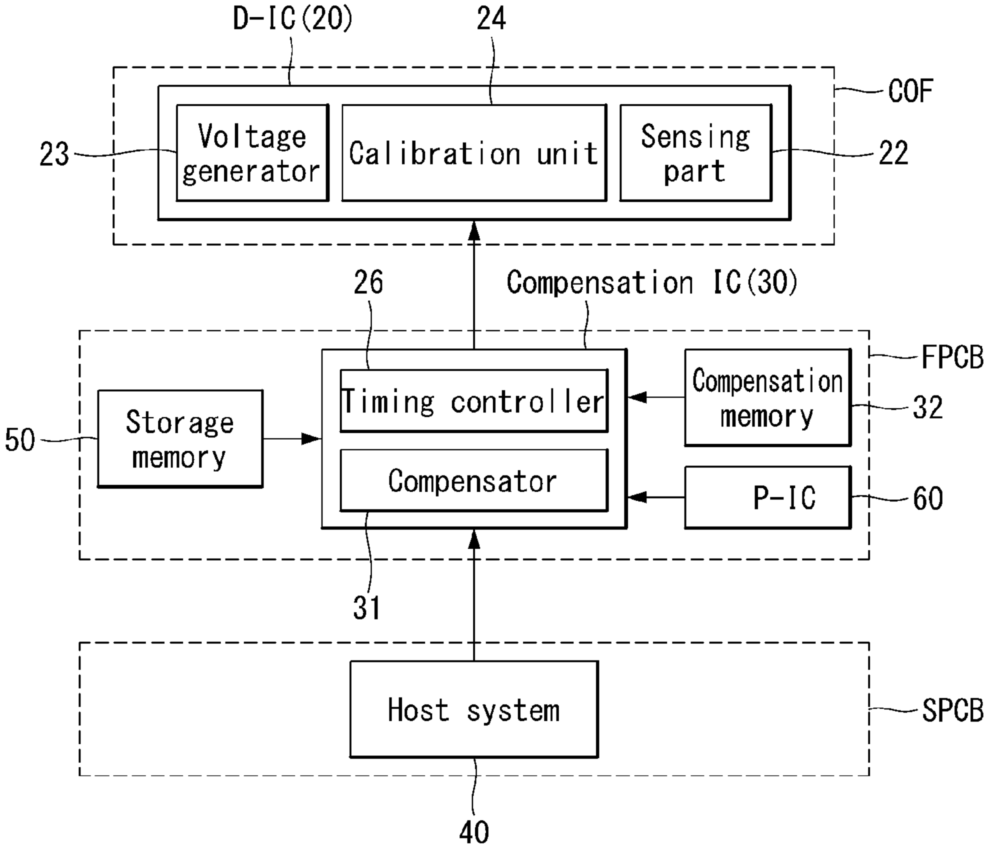

FIGS. 7 to 9 illustrate various examples of an external compensation module.

Referring to FIG. 7, the electroluminescent display according to the aspect may include a driver IC (or referred to as "D-IC") 20 mounted on a chip-on film (COF), a storage memory 50 and a power IC (or referred to as "P-IC") 60 mounted on a flexible printed circuit board (FPCB), and a host system 40 mounted on a system printed circuit board (SPCB), in order to implement an external compensation module.

The driver IC (D-IC) 20 may further include a calibration unit 24, a compensator 31, and a compensation memory 32 in addition to a timing controller 26, a sensing part 22, and a data voltage generator 23. The external compensation module is implemented by combining the driver IC (D-IC) 20 and a compensation IC 30 (see FIG. 1) into one chip. The power IC (P-IC) 60 generates various driving powers required to operate the external compensation module.

Referring to FIG. 8, the electroluminescent display according to the aspect may include a driver IC (or referred to as "D-IC") 20 mounted on a chip-on film (COF), a storage memory 50 and a power IC (or referred to as "P-IC") 60 mounted on a flexible printed circuit board (FPCB), and a host system 40 mounted on a system printed circuit board (SPCB), in order to implement an external compensation module.

The external compensation module of FIG. 8 is different from the external compensation module of FIG. 7 in that a compensator 31 and a compensation memory 32 are mounted on the host system 40 without being mounted on the driver IC (D-IC) 20. The external compensation module of FIG. 8 is implemented by integrating a compensation IC 30 (shown in FIG. 1) into the host system 40 and is meaningful in that the configuration of the driver IC (D-IC) 20 can be simplified.

Referring to FIG. 9, the electroluminescent display according to the aspect may include a driver IC (or referred to as "D-IC") 20 mounted on a chip-on film (COF), a storage memory 50, a compensation IC 30, a compensation memory 32, and a power IC (or referred to as "P-IC") 60 mounted on a flexible printed circuit board (FPCB), and a host system 40 mounted on a system printed circuit board (SPCB), in order to implement an external compensation module.

The external compensation module of FIG. 9 is different from the external compensation modules of FIGS. 7 and 8 in that the configuration of the driver IC (D-IC) 20 is further simplified by mounting only a voltage generator 23, a sensing part 22, and a calibration unit 24 in the driver IC (D-IC) 20, and a timing controller 26 and a compensator 31 are mounted in the compensation IC 30 that is separately manufactured. The external compensation module of FIG. 9 can easily perform an uploading and downloading operation of a compensation parameter by together mounting the compensation IC 30, the storage memory 50, and the compensation memory 32 on the flexible printed circuit board (FPCB).

FIGS. 10A to 10D illustrate various examples of a driver integrated circuit for external compensation.

Figure 10A:
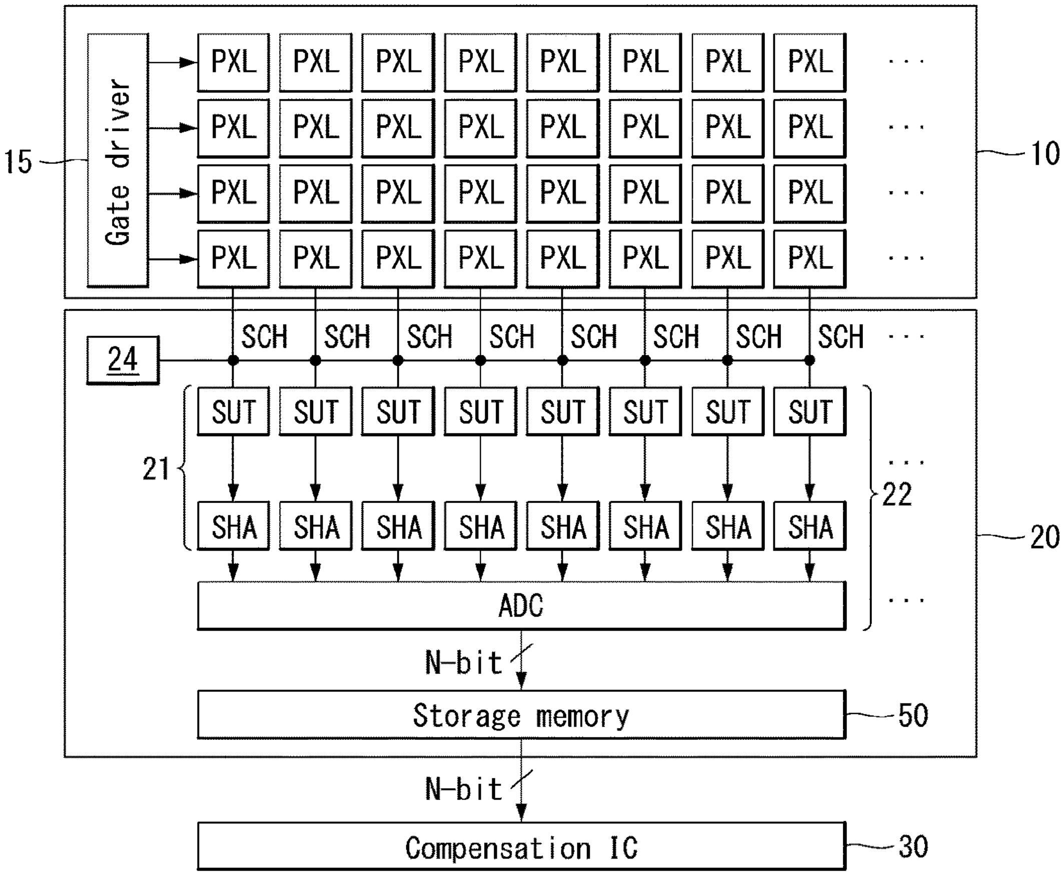
FIGS. 10A to 10D illustrate various examples of a driver integrated circuit for external compensation.
Figure 10B:
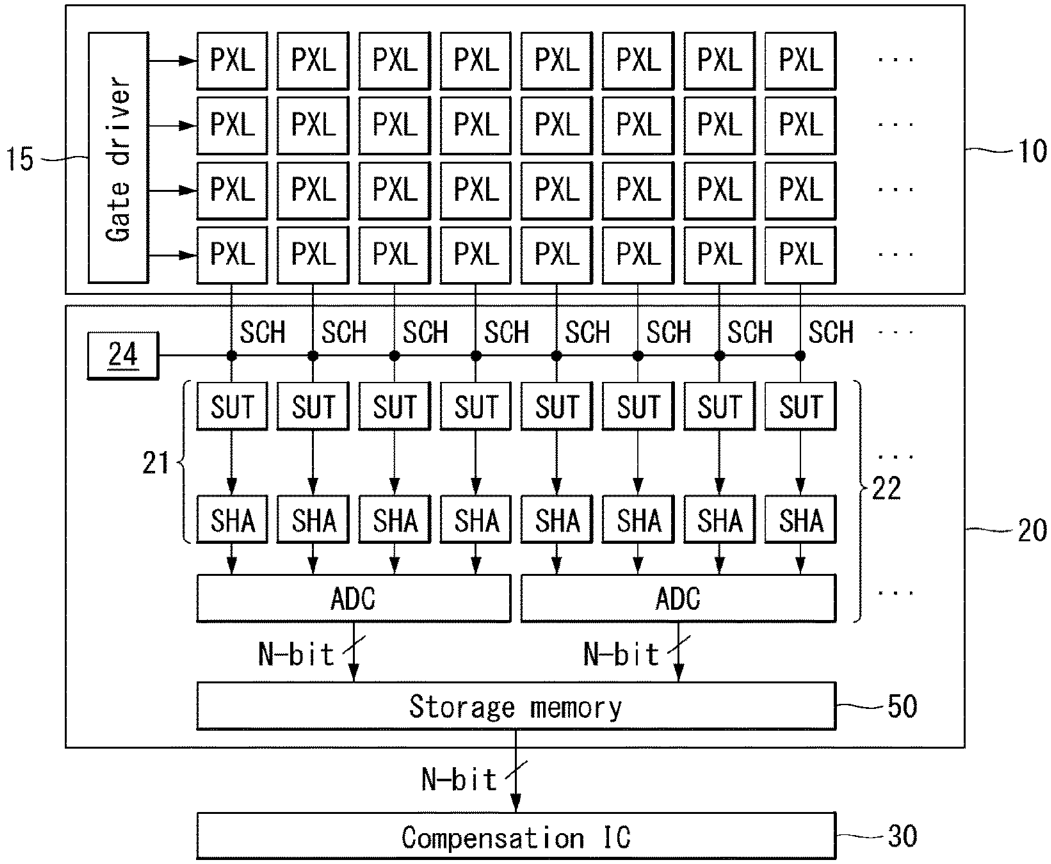
Figure 10C:
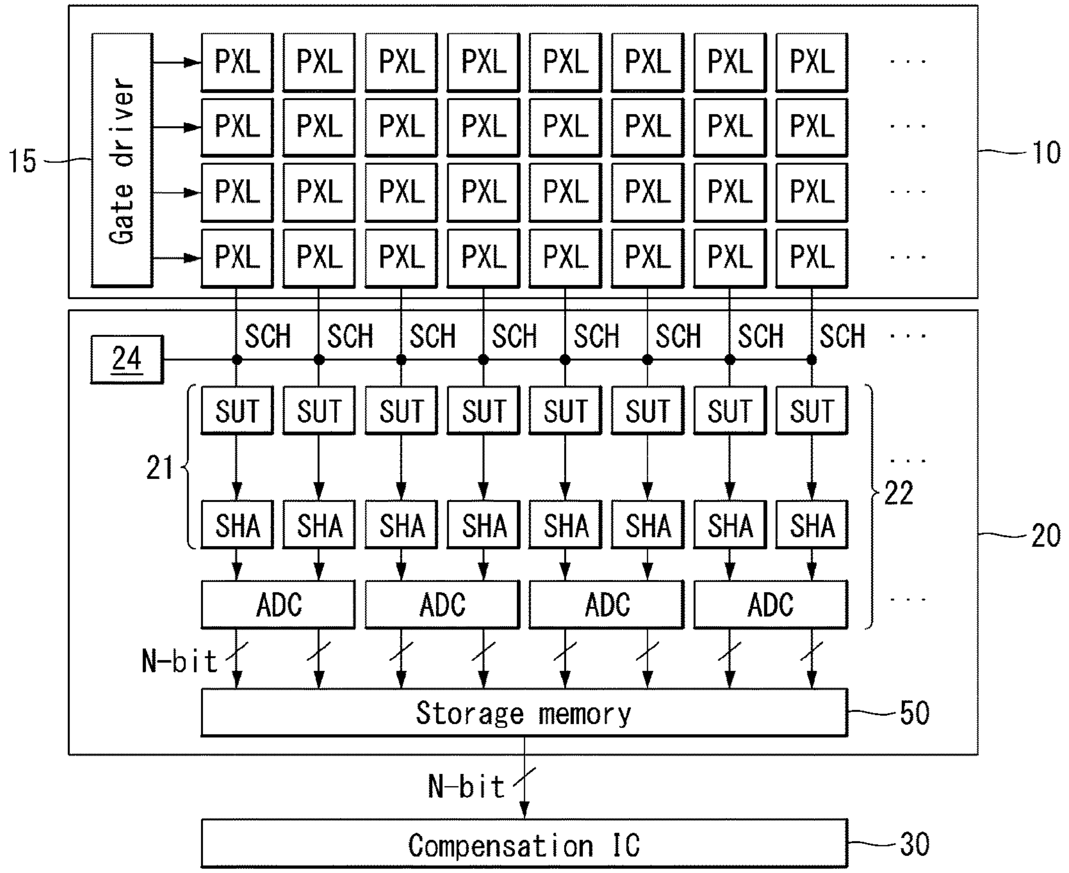
Figure 10D:
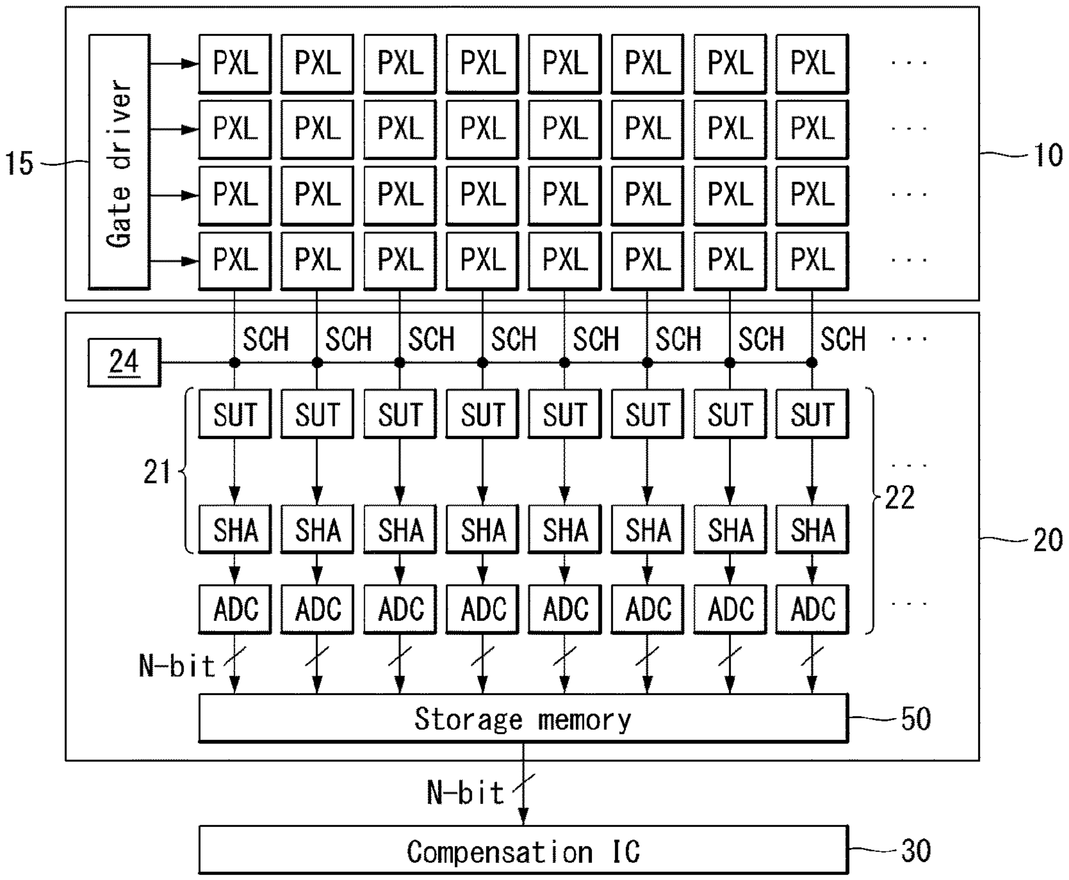

One ADC or a plurality of ADCs may be mounted inside the driver IC 20. In other words, as shown in FIGS. 10A to 10D, at least one sensor 21 may be connected to the ADC. For example, as shown in FIG. 10A, eight sensors 21 may be connected for each ADC; as shown in FIG. 10B, four sensors 21 may be connected for each ADC; as shown in FIG. 10C, two sensors 21 may be connected for each ADC; and as shown in FIG. 10D, the sensors 21 may be respectively connected to the ADCs. In FIGS. 10A to 10C, a multiplexer (or mux) switch may be further connected between the plurality of sensors 21 and the ADC and may sequentially supply signals input from the sensors 21 to the ADC.

A sampling rate of the ADC and the accuracy of the sensing are in a trade-off relationship. Because an amount of sensing data to be processed by each ADC decreases as the number of ADCs mounted in the driver IC 20 increases, the sampling rate of the ADC can be reduced and the accuracy of the sensing can increase. However, when the number of ADCs increases, an area occupied by the ADC in the driver IC 20 may increase. The number of ADCs may be appropriately designed depending on the model, the specification, etc. of the display device.

Referring to FIGS. 10A to 10D, at least one sensor 21 may be electrically connected to each sensing channel terminal SCH. FIGS. 10A to 10D illustrate that one sensor 21 is connected to each sensing channel terminal SCH, by way of example. However, a plurality of sensors 21 may be connected to each sensing channel terminal SCH. When the plurality of sensors 21 is connected to each sensing channel terminal SCH, the number of sensing channel terminals SCH of the driver IC 20 may decrease. Hence, circuit configuration of the driver IC 20 can be simplified. A switching unit is connected between the sensing channel terminal SCH and the sensor 21, but is not shown in FIGS. 10A to 10D.

Referring to FIGS. 10A to 10D, the calibration unit 24 may be commonly connected to the sensing channel terminals SCH. The calibration unit 24 commonly supplies the calibration voltage to each sensor 21 through each sensing channel terminal SCH.

Figures 11, 12:
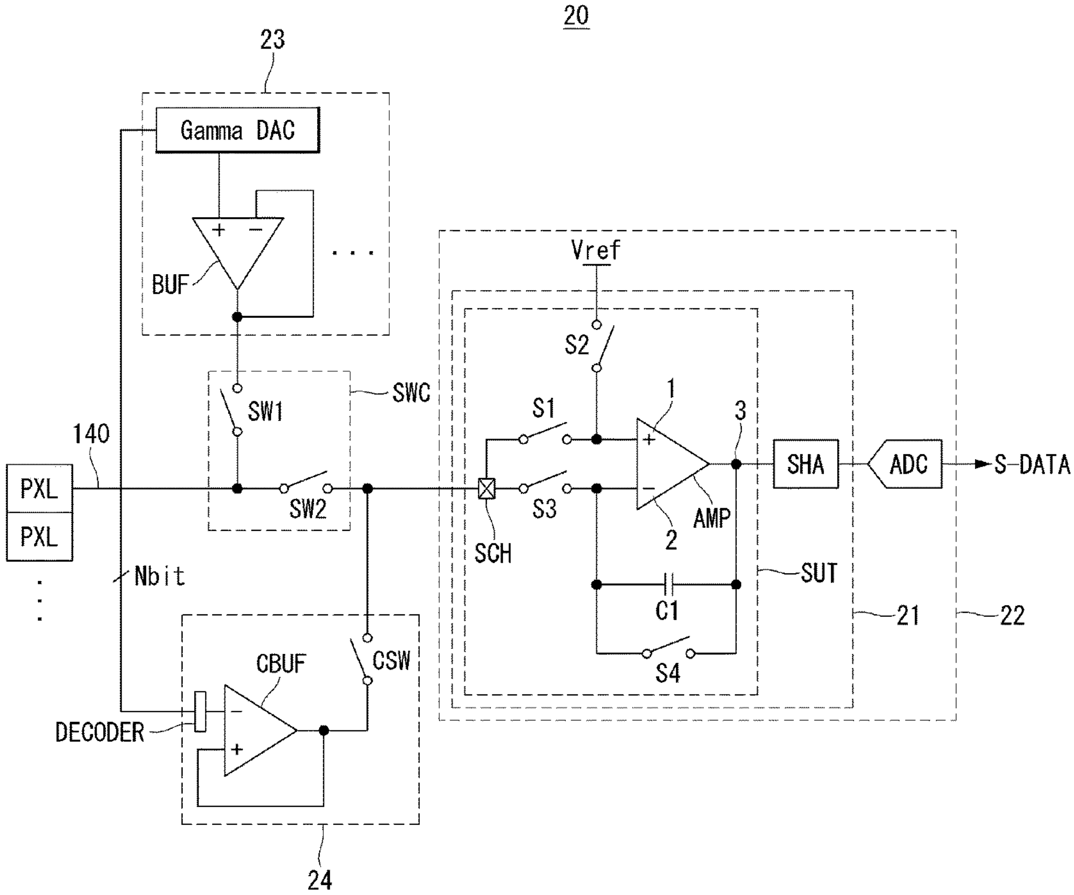
FIG. 11 illustrates configuration of a driver integrated circuit for external compensation including a calibration unit according to an aspect of the disclosure.
FIG. 12 illustrates an operation state of switches of the driver integrated circuit for external compensation of FIG. 11 in a current sensing mode and a calibration mode.
Figure 13:
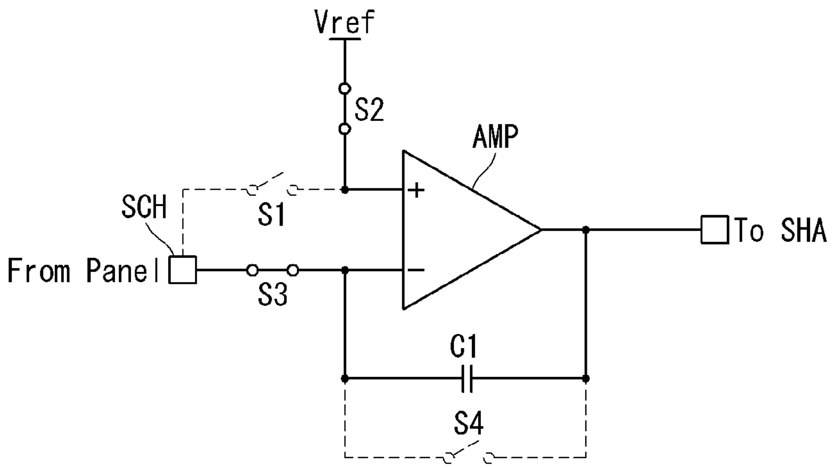
FIG. 13 is an equivalent circuit diagram of a sensing unit in a current sensing mode of FIG. 12.
Figure 14:
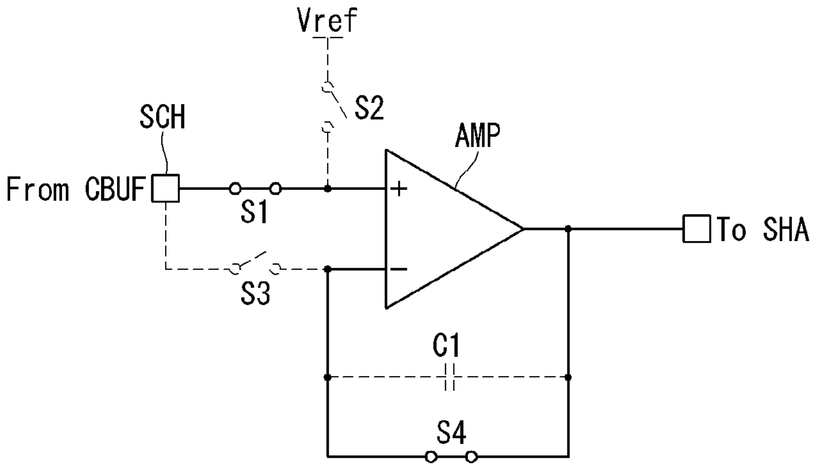
FIG. 14 is an equivalent circuit diagram of a sensing unit in a calibration mode of FIG. 12.

FIG. 11 illustrates configuration of a driver IC for external compensation including a calibration unit according to an aspect of the disclosure. FIG. 12 illustrates an operation state of switches of the driver IC for external compensation of FIG. 11 in a current sensing mode and a calibration mode. FIG. 13 is an equivalent circuit diagram of a sensing unit in the current sensing mode of FIG. 12. FIG. 14 is an equivalent circuit diagram of a sensing unit in the calibration mode of FIG. 12.

Referring to FIG. 11, a driver IC 20 for external compensation according to an aspect may include a sensing part 22, a voltage generator 23, a calibration unit 24, and a switching unit SWC. The sensing part 22 may further include a sensor 21 including a sensing unit SUT and a sample and holder SHA and an ADC.

A gamma DAC of the voltage generator 23 is connected to the switching unit SWC through a buffer BUF. The gamma DAC generates a display data voltage Vdata-DIS and a sensing data voltage Vdata-SEN and supplies them to the buffer BUF. The buffer BUF stabilizes the data voltages Vdata-DIS and Vdata-SEN received from the gamma DAC and then outputs them to the switching unit SWC.

The switching unit SWC is connected between the voltage generator 23, a pixel PXL, and the sensing part 22 and controls signal flow between the voltage generator 23 and the pixel PXL and signal flow between the pixel PXL and the sensing part 22. The switching unit SWC includes a first switch SW1 connected between the voltage generator 23 and the pixel PXL through a data line 140 and a second switch SW2 connected between the pixel PXL and a sensing channel terminal SCH of the sensing part 22. As shown in FIG. 12, the first switch SW1 and the second switch SW2 are turned on and off in the opposite manner in a current sensing mode, and are both turned off in a calibration mode.

The calibration unit 24 decodes N-bit calibration data input from the voltage generator 23 to generate at least one calibration voltage, where N is a positive integer. The calibration voltage may be implemented as voltages of a plurality of gray levels corresponding to particular representative gray levels. When the calibration mode is performed a plurality of times by applying the voltages of the plurality of gray levels to the sensing part 22, output characteristics of the ADC can be sensed more accurately.

The calibration unit 24 may be commonly connected to the plurality of sensors 21 through the plurality of sensing channel terminals SCH. Namely, in the driver IC 20, one calibration unit 24 may be commonly connected to the plurality of sensing parts 22. Thus, the calibration voltage, which is directly applied to the sensing part 22 by the calibration unit 24, may be a value independent of an output variation between the gamma DACs. Hence, the output characteristics of the ADC can be sensed more accurately.

The calibration unit 24 includes a decoder that decodes the N-bit calibration data to generate the calibration voltage, a calibration buffer CBUF for stabilizing the calibration voltage output from the decoder, and a calibration switch CSW connected between an output terminal of the calibration buffer CBUF and the plurality of sensing channel terminals SCH. The decoder is connected between the gamma DAC and the calibration buffer CBUF, and more specifically, connected to an inverting input terminal of the calibration buffer CBUF. A non-inverting input terminal and an output terminal of the calibration buffer CBUF are short-circuited to provide feedback. The calibration buffer CBUF may operate as a voltage follower that stabilizes the calibration voltage output from the decoder. As shown in FIG. 12, the calibration switch CSW is turned on in the calibration mode and is turned off in the sensing mode.

The sensor 21 may include a hybrid sensing unit SUT capable of performing both a current sensing operation and a voltage sensing operation. The sensing unit SUT may operate as a voltage/current sensing circuit depending on a switching operation of a plurality of sensing switches. In other words, the sensing unit SUT may operate as a current integrator capable of sensing a driving current flowing in the pixel PXL in the sensing mode, and may operate as a voltage follower capable of sensing the calibration voltage in the calibration mode.

In the sensing mode, the sensing unit SUT operates as the current integrator. The sensing unit SUT converts the driving current flowing in the pixel PXL into a voltage and supplies the voltage to the sample and holder SHA. The sample and holder SHA samples the voltage input from the sensing unit SUT and supplies the ADC with the sampled voltage as analog sensing data. The ADC converts the analog sensing data into second characteristic data S-DATA indicating electrical characteristics of the pixel PXL and supplies the second characteristic data S-DATA to a compensation IC 30. The compensation IC 30 may determine a magnitude of the driving current flowing in the pixel PXL based on the second characteristic data S-DATA.

Further, when the sensing unit SUT operates as the current integrator, a reference voltage Vref from the outside may be applied to a non-inverting input terminal of an amplifier AMP. The reference voltage Vref may be received from the gamma DAC of the voltage generator 23.

When the sensing unit SUT operates as the current integrator, a sensing speed is fast and micro-currents can be sensed. More specifically, because a capacitance of a feedback capacitor C1 included in the current integrator are greatly less than a parasitic capacitance present in the data line 140, time required to accumulate the driving current up to a sensible integral level is greatly less than time required to sense the voltage charged to the data line 140. Further, unlike a parasitic capacitor of the sensing line 150, the feedback capacitor C1 included in the current integrator is advantageous in that a stored value does not vary depending on a display load, and a calibration process is easily performed.

In the calibration mode, the sensing unit SUT operates as the voltage follower. In the calibration mode, an offset of the amplifier AMP included in each of the sensing unit SUT and the ADC is sensed and reflected in first characteristic data C-DATA indicating output characteristics of the ADC. A reference level of the amplifier AMP may be changed due to a mismatch, a process variation, etc. of the amplifier AMP and is referred to as an offset or an offset voltage.

In the calibration mode, an offset value of the sensing unit SUT, an offset value of the ADC, etc. may be included in an output of the ADC. The first characteristic data C-DATA obtained and stored in the calibration mode is to compensate for offset variations.

As shown in FIG. 11, the sensing unit SUT may further include the amplifier AMP, a plurality of sensing switches S1 to S4 connected to the amplifier AMP, and the feedback capacitor C1.

The amplifier AMP has a non-inverting (+) input terminal 1, an inverting (−) input terminal 2, and an output terminal 3.

The first sensing switch S1 is connected between the sensing channel terminal SCH and the non-inverting (+) input terminal 1 of the amplifier AMP, and the second sensing switch S2 is connected between an output terminal of the reference voltage Vref and the non-inverting (+) input terminal 1 of the amplifier AMP. The third sensing switch S3 is connected between the sensing channel terminal SCH and the inverting (−) input terminal 2 of the amplifier AMP, and the fourth sensing switch S4 is connected between the inverting (−) input terminal 2 and the output terminal 3 of the amplifier AMP.

The feedback capacitor C1 is connected between the inverting (−) input terminal 2 and the output terminal 3 of the amplifier AMP.

As shown in FIGS. 12 and 13, the sensing mode may include a first period, in which the voltage generator 23 applies the sensing data voltage Vdata-SEN to the pixel PXL, and a second period in which the sensing unit SUT operates as the current integrator and senses the driving current flowing in the pixel PXL. In the first period, each of first and second switches SW1 and SW2 constituting the switching unit SWC is turned on and off. In the second period, each of the first and second switches SW1 and SW2 of the switching unit SWC is turned off and on. In the second period, the second and third sensing switches S2 and S3 of the sensing unit SUT are turned on, and the first and fourth sensing switches S1 and S4 of the sensing unit SUT are turned off. Further, in the sensing mode, the calibration switch CSW is turned off.

As a result, the driving current flowing in the pixel PXL corresponding to the sensing data voltage Vdata-SEN is applied to the sensing unit SUT through the sensing channel terminal SCH and is converted into a voltage while being accumulated to the feedback capacitor C1 of the sensing unit SUT. Then, the voltage is output to the sample and holder SHA.

As shown in FIGS. 12 and 14, when the sensing unit SUT operates as the voltage follower in the calibration mode, the first and fourth sensing switches S1 and S4 of the sensing unit SUT are turned on, and the second and third sensing switches S2 and S3 of the sensing unit SUT are turned off. In the calibration mode, the calibration switch CSW is turned on. Further, the first and second switches SW1 and SW2 of the switching unit SWC are turned off.

As a result, the calibration voltage is applied to the sensing unit SUT from the calibration unit 24, is stabilized through the sensing unit SUT operating as the voltage follower, and is output to the sample and holder SHA.

Figure 15:
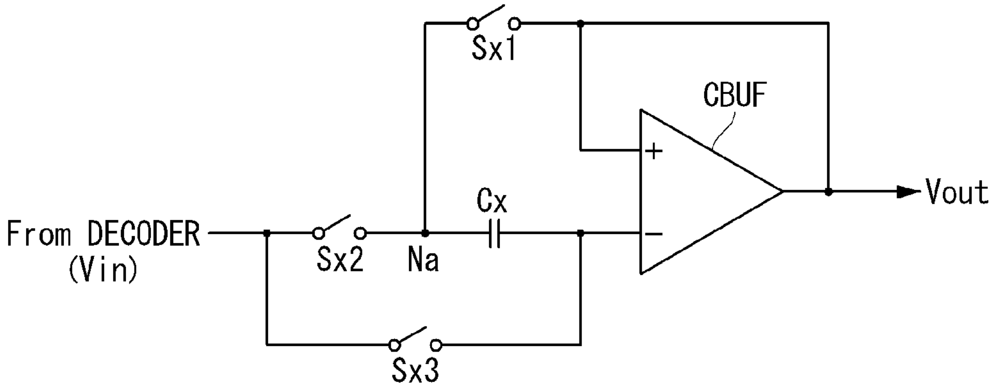
FIG. 15 is a circuit diagram of a calibration unit according to another aspect of the disclosure.
Figure 16:
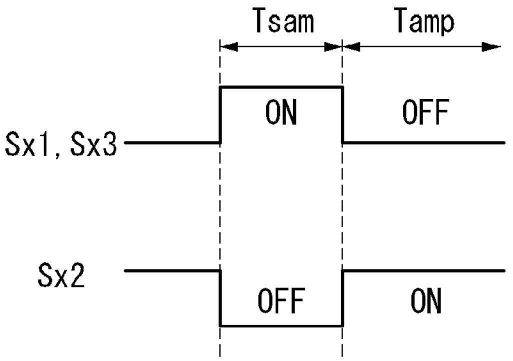
FIG. 16 is a waveform diagram illustrating an operation of removing an offset voltage of the calibration unit shown in FIG. 15.

FIG. 15 is a circuit diagram of a calibration unit according to another example aspect. FIG. 16 is a waveform diagram illustrating an operation of removing an offset voltage of the calibration unit shown in FIG. 15. More specifically, FIG. 15 illustrates that the decoder and the calibration switch CSW are omitted in the calibration unit 24 of FIG. 11.

Referring to FIG. 15, a calibration unit 24 according to another example aspect may further include an auto-zeroing circuit for cancelling an offset voltage of a calibration buffer CBUF. When the offset voltage of the calibration buffer CBUF is cancelled, output characteristics of an ADC are not affected by the offset voltage of the calibration buffer CBUF. Therefore, the accuracy of sensing the output characteristics of the ADC can be further improved.

The auto-zeroing circuit may be implemented in various ways. For example, as shown in FIG. 15, the auto-zeroing circuit may include first to third offset cancellation switches Sx1, Sx2, and Sx3 and an offset cancellation capacitor Cx.

One terminal of the first offset cancellation switch Sx1 is commonly connected to a non-inverting input terminal (+) and an output terminal of the calibration buffer CBUF, and the other terminal is connected to a node A Na.

The second offset cancellation switch Sx2 is connected between an output terminal of a decoder and the node A Na.

The third offset cancellation switch Sx3 is connected between the output terminal of the decoder and an inverting input terminal (−) of the calibration buffer CBUF.

The offset cancellation capacitor Cx is connected between the node A Na and the inverting input terminal (−) of the calibration buffer CBUF and is connected in parallel to the third offset cancellation switch Sx3.

As shown in FIG. 16, an auto-zeroing process of the auto-zeroing circuit may be performed through a sampling period Tsam and an amplification phase period Tamp.

In the sampling period Tsam, an offset voltage generated in the calibration buffer CBUF is stored in the offset cancellation capacitor Cx. To this end, in the sampling period Tsam, the first and third offset cancellation switches Sx1 and Sx3 are turned on, and the second offset cancellation switch Sx2 is turned off. In the sampling period Tsam, an output voltage Vout of the calibration buffer CBUF is a sum of an output voltage Vin of the decoder and the offset voltage generated in the calibration buffer CBUF.

In the amplification phase period Tamp, the offset voltage of the calibration buffer CBUF stored in the offset cancellation capacitor Cx is applied to the non-inverting input terminal (+) of the calibration buffer CBUF, and thus is cancelled. To this end, in the amplification phase period Tamp, the first and third offset cancellation switches Sx1 and Sx3 are turned off, and the second offset cancellation switch Sx2 is turned on. In the amplification phase period Tamp, the output voltage Vout of the calibration buffer CBUF does not include the offset voltage and is substantially equal to the output voltage Vin of the decoder.

As described above, aspects of the present disclosure can increase a sensing performance and a compensation performance of the electrical characteristics of the pixels by compensating for the characteristic variation between the ADCs.

Furthermore, aspects of the present disclosure can accurately sense the output characteristics of the ADCs regardless of the output variation between the gamma DACs by commonly supplying the calibration voltage to the plurality of sensors through the calibration buffer capable of performing the auto-zeroing.

Although various aspects have been described with reference to a number of illustrative aspects thereof, numerous other modifications and aspects may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A driver integrated circuit comprising:

a voltage generator generating a sensing data voltage;

a calibration circuit decoding N-bit calibration data input from the voltage generator and generating at least one calibration voltage, where N is a positive integer; a sensor sampling a signal output from a pixel corresponding to the sensing data voltage in a sensing mode for sensing electrical characteristics of the pixel;

an analog-to-digital converter converting an analog signal sampled by the sensor into a digital signal, wherein output characteristics of the analog-to-digital converter is sensed by the sensor sampling the at least one calibration voltage in a calibration mode, wherein the sensor includes a hybrid sensing unit capable of performing both a current sensing operation and a voltage sensing operation, and wherein the hybrid sensing unit is implemented as a current sensing unit capable of directly sensing a driving current flowing in the pixel in the sensing mode, and the hybrid sensing unit is implemented as a voltage sensing unit capable of sensing the calibration voltage in the calibration mode, and wherein the hybrid sensing unit comprises:

an amplifier having a non-inverting input terminal, an inverting input terminal, and an output terminal;

a first sensing switch connected between a sensing channel terminal connected to the pixel and the non-inverting input terminal of the amplifier;

a second sensing switch connected between an output terminal of a reference voltage and the non-inverting input terminal of the amplifier;

a third sensing switch connected between the sensing channel terminal and the inverting input terminal of the amplifier; and a fourth sensing switch and a feedback capacitor connected in parallel between the inverting input terminal and the output terminal of the amplifier.

2. The driver integrated circuit of claim 1, further comprising a plurality of sensors commonly connected to the calibration circuit through a plurality of sensing channel terminals.

3. The driver integrated circuit of claim 2, wherein the calibration circuit comprises:

a decoder decoding the N-bit calibration data and generating the calibration voltage;

a calibration buffer stabilizing the calibration voltage output from the decoder; and a calibration switch connected between an output terminal of the calibration buffer and the plurality of sensing channel terminals.

4. The driver integrated circuit of claim 3, wherein the calibration switch is turned on in the calibration mode and is turned off in the sensing mode.

5. The driver integrated circuit of claim 1, wherein the hybrid sensing unit operates as a current integrator in which the second and third sensing switches are turned on and the first and fourth sensing switches are turned off in the sensing mode, and the hybrid sensing unit operates as a voltage follower in which the first and fourth sensing switches are turned on and the second and third sensing switches are turned off in the calibration mode.

6. The driver integrated circuit of claim 1, further comprising a switching unit that operates differently in the sensing mode and the calibration mode.

7. The driver integrated circuit of claim 6, wherein the switching unit comprises:

a first switch connected between the voltage generator and the pixel; and a second switch connected between the pixel and a sensing channel terminal connected to the pixel.

8. The driver integrated circuit of claim 7, wherein the first switch and the second switch of the switching unit are turned on and off, respectively in the sensing mode, and both the first and second switches are turned off in the calibration mode.

9. The driver integrated circuit of claim 3, wherein the calibration circuit further comprises:

a first offset cancellation switch, of which one terminal is commonly connected to a non-inverting input terminal and the output terminal of the calibration buffer, and the other terminal is connected to a node A;

a second offset cancellation switch connected between an output terminal of the decoder and the node A;

a third offset cancellation switch connected between the output terminal of the decoder and an inverting input terminal of the calibration buffer; and an offset cancellation capacitor connected between the node A and the inverting input terminal of the calibration buffer.

10. The driver integrated circuit of claim 9, wherein the first and third offset cancellation switches are turned on, and the second offset cancellation switch is turned off during a sampling period in which an offset voltage generated in the calibration buffer is stored in the offset cancellation capacitor, and the first and third offset cancellation switches are turned off, and the second offset cancellation switch is turned on during an amplification phase period in which the offset voltage of the calibration buffer stored in the offset cancellation capacitor is applied to the non-inverting input terminal of the calibration buffer and is cancelled.

11. A display device comprising:

a display panel including a plurality of pixels and data lines respectively connected to the plurality of pixels; and a driver integrated circuit connected to the display panel through the data lines and comprises:

a voltage generator generating a sensing data voltage;

a calibration circuit decoding N-bit calibration data input from the voltage generator and generating at least one calibration voltage, where N is a positive integer; a sensor sampling a signal output from a pixel corresponding to the sensing data voltage in a sensing mode for sensing electrical characteristics of the pixel;

an analog-to-digital converter converting an analog signal sampled by the sensor into a digital signal, wherein output characteristics of the analog-to-digital converter is sensed by the sensor sampling the at least one calibration voltage in a calibration mode, wherein the sensor includes a hybrid sensing unit capable of performing both a current sensing operation and a voltage sensing operation, and wherein the hybrid sensing unit is implemented as a current sensing unit capable of directly sensing a driving current flowing in the pixel in the sensing mode, and the hybrid sensing unit is implemented as a voltage sensing unit capable of sensing the calibration voltage in the calibration mode, and wherein the hybrid sensing unit comprises:

an amplifier having a non-inverting input terminal, an inverting input terminal, and an output terminal;

a first sensing switch connected between a sensing channel terminal connected to the pixel and the non-inverting input terminal of the amplifier;

a second sensing switch connected between an output terminal of a reference voltage and the non-inverting input terminal of the amplifier;

a third sensing switch connected between the sensing channel terminal and the inverting input terminal of the amplifier; and a fourth sensing switch and a feedback capacitor connected in parallel between the inverting input terminal and the output terminal of the amplifier.

12. The display device of claim 11, further comprising a compensation integrated circuit including a compensating circuit and a compensation memory connected between a storage memory and a host system.

13. The display device of claim 12, wherein the compensating circuit receives first characteristic data indicating output characteristics of the analog-to-digital converter and second characteristic data indicating electrical characteristics of the pixel from the analog-to-digital converter.

14. The display device of claim 12, wherein the compensating circuit corrects input image data based on the first characteristic data and the second characteristic data.

15. The display device of claim 11, further comprising a switching unit that operates differently in the sensing mode and the calibration mode.

16. The display device of claim 15, wherein the switching unit comprises:

a first switch connected between the voltage generator and the pixel; and a second switch connected between the pixel and a sensing channel terminal connected to the pixel.

17. The display device of claim 16, wherein the first switch and the second switch of the switching unit are turned on and off, respectively in the sensing mode, and both the first and second switches are turned off in the calibration mode.

* * * * *